(12) United States Patent
Oh et al.

(10) Patent No.: US 10,985,047 B2
(45) Date of Patent: Apr. 20, 2021

(54) SEMICONDUCTOR MANUFACTURING APPARATUS AND DRIVING METHOD OF THE SAME

(71) Applicant: SAMSUNG ELECTRONICS CO., LTD., Suwon-si (KR)

(72) Inventors: Sung-Sik Oh, Hwaseong-si (KR); Jun-Taek Seo, Hwaseong-si (KR); Tae-Hwa Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 194 days.

(21) Appl. No.: 16/044,778

(22) Filed: Jul. 25, 2018

(65) Prior Publication Data

US 2019/0115245 A1  Apr. 18, 2019

(30) Foreign Application Priority Data

Oct. 13, 2017 (KR) .................... 10-2017-0133115

(51) Int. Cl.
*H01L 21/687* (2006.01)
*H01L 21/677* (2006.01)
(Continued)

(52) U.S. Cl.
CPC .. *H01L 21/68707* (2013.01); *H01L 21/67109* (2013.01); *H01L 21/67248* (2013.01); *H01L 21/67253* (2013.01); *H01L 21/67259* (2013.01); *H01L 21/67288* (2013.01); *H01L 21/67766* (2013.01); *H01L 21/681* (2013.01);
(Continued)

(58) Field of Classification Search
CPC ......... H01L 21/68714; H01L 21/68764; H01L 21/68785; H01L 23/34; H01L 21/6838; H01L 21/68735; H01L 21/68742; H01L 21/68707; H01L 21/67259; H01L 21/67288; H01L 21/687
See application file for complete search history.

(56) References Cited

U.S. PATENT DOCUMENTS

2003/0197388 A1  10/2003  Shih et al.
2010/0157261 A1*  6/2010  Lee .................. H01L 21/67109
                                                            355/30
(Continued)

FOREIGN PATENT DOCUMENTS

JP       2011-243834 A    12/2011
KR   10-2005-0105364 A    11/2005
(Continued)

OTHER PUBLICATIONS

KR-20050105364-A EspaceNet Translation (Year: 2005).*

*Primary Examiner* — Tyrone V Hall, Jr.
*Assistant Examiner* — Makena S Markman
(74) *Attorney, Agent, or Firm* — Lee IP Law, PC (57) ABSTRACT

A semiconductor manufacturing apparatus includes a temperature stabilizer, a chuck, an actuator, and a controller. The temperature stabilizer is on a plane defined by a first direction and a second direction crossing the first direction. The chuck supports and rotates a wafer and passes through a center of the temperature stabilizer. The actuator is connected to the temperature stabilizer and moves the temperature stabilizer in a third direction crossing to the first and second directions. The controller controls driving of the actuator.

10 Claims, 8 Drawing Sheets

(51) Int. Cl.
  *H01L 21/67* (2006.01)
  *H01L 21/683* (2006.01)
  *H01L 21/68* (2006.01)

(52) U.S. Cl.
  CPC .... *H01L 21/6838* (2013.01); *H01L 21/68742* (2013.01); *H01L 21/68764* (2013.01); *H01L 21/68785* (2013.01)

(56) References Cited

U.S. PATENT DOCUMENTS

| | | |
|---|---|---|
| 2015/0206723 A1 | 7/2015 | Yoo |
| 2015/0243542 A1* | 8/2015 | Yoshihara ........... H01L 21/6708 156/345.15 |
| 2017/0154804 A1* | 6/2017 | Angelov ............. H01L 21/3065 |
| 2017/0178942 A1* | 6/2017 | Sakata .............. H01L 21/67772 |

FOREIGN PATENT DOCUMENTS

| | | | |
|---|---|---|---|
| KR | 20050105364 A | * | 11/2005 |
| KR | 10-2007-0115248 A | | 12/2007 |
| KR | 10-2010-0131121 A | | 12/2010 |

\* cited by examiner

SEMICONDUCTOR MANUFACTURING APPARATUS AND DRIVING METHOD OF THE SAME

CROSS-REFERENCE TO RELATED APPLICATION

Korean Patent Application No. 10-2017-0133115, filed on Oct. 13, 2017, and entitled, "Semiconductor Manufacturing Apparatus and Driving Method of the Same," is incorporated by reference herein in its entirety.

BACKGROUND

1. Field

One or more embodiments herein relate to a semiconductor manufacturing apparatus and a method for driving a semiconductor manufacturing apparatus.

2. Description of the Related Art

A variety of semiconductor wafer exposure apparatuses have been developed. One apparatus may perform a pre-alignment process that involves maintaining the alignment of a wafer before the wafer is seated on a wafer stage and an exposure process is performed. The semiconductor manufacturing apparatus which performs the pre-alignment process is provided separately from other apparatuses. During the pre-alignment process, scratches may be formed on a back surface of the wafer as temperature is maintained at an appropriate level. In order to prevent or reduce the number of the scratches on the wafer, operation of the semiconductor manufacturing apparatus is stopped.

SUMMARY

In accordance with one or more embodiments, a semiconductor manufacturing apparatus includes a temperature stabilizer on a plane defined by a first direction and a second direction crossing the first direction; a chuck to support and rotate a wafer, the chuck passing through a center of the temperature stabilizer; an actuator, connected to the temperature stabilizer, to move the temperature stabilizer in a third direction crossing to the first and second directions; and a controller to control driving of the actuator. The actuator may include a first actuator, a second actuator, and a third actuator disposed along an edge of the temperature stabilizer, and the first, second and third actuators may tilt the temperature stabilizer at a predetermined angle relative to the plane.

In accordance with one or more other embodiments, a method for driving a semiconductor manufacturing apparatus includes (a) placing a wafer on a chuck of the semiconductor manufacturing apparatus, which includes a temperature stabilizer, the chuck, an actuator connected to the temperature stabilizer, and a controller to control the actuator; (b) aligning a position of the wafer while cooling the wafer; and (c) performing a process on the cooled and aligned wafer, wherein (b) includes cooling the wafer using the compressed air from the compressed air provider of the temperature stabilizer and simultaneously moving the temperature stabilizer by the actuator to control the distance between the wafer and the temperature stabilizer to a predetermined range in real time.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
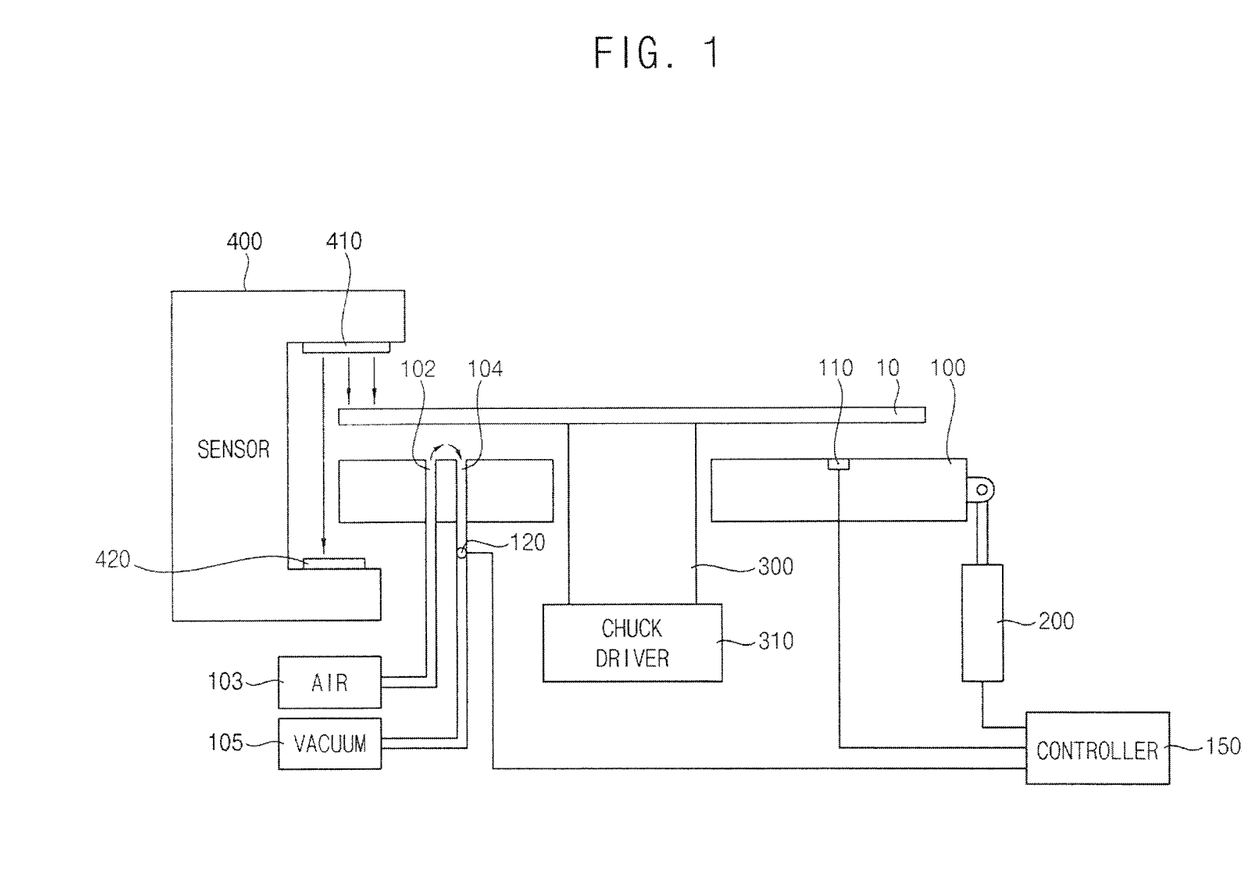
FIG. 1 illustrates an embodiment of a semiconductor manufacturing apparatus.

FIG. 1 illustrates a cross-sectional view of an embodiment of a semiconductor manufacturing apparatus which may include a temperature stabilizing unit (temperature stabilizer) 100, a compressed air generator 103, a vacuum generator 105, a controller 150, an actuator 200, a chuck 300, a chuck driver 310, and an edge sensor part 400.

The temperature stabilizing unit 100 may lower the temperature of a wafer 10 thereon to a specific temperature. The temperature stabilizing unit 100 may have a predetermined (e.g., circular) shape on a plane formed by a first direction (e.g., see D1 in FIG. 2) and a second direction D2. The temperature stabilizing unit 100 has an opening (e.g., at its center) through which the chuck 300 may support the wafer 10.

A proximity sensor 110 may be on an upper surface of the temperature stabilizing unit 100. In one embodiment, the proximity sensor 110 may be in the temperature stabilizing unit 100 and exposed on the upper surface of the temperature stabilizing unit 100. The proximity sensor 110 may be electrically connected to the controller 150. The proximity sensor 110 may measure the distance between the wafer 10 and the temperature stabilizing unit 100 and provide a corresponding proximity sensor signal to the controller 150.

The proximity sensor 110 may include, for example, a light emitting part (or area) and a light receiving part (or area). The proximity sensor 110 may determine proximity information of an object based on amount of received light of the light receiving part which is generated from the light emitting part and reflected by the object. Accordingly, the proximity sensor 110 may measure the distance between the wafer 10 and the temperature stabilizing unit 100, and may provide the proximity sensor signal to the controller 150 including information corresponding to the distance.

Three or more of the proximity sensors 110 may be installed in the temperature stabilizing unit 106. The proximity sensors 110 may be arranged in a predetermined (e.g., triangular) shape in order to more accurately measure the distance between the wafer 10 and the temperature stabilizing unit 100. (e.g., refer to FIG. 2)

A compressed air provider 102 which provides compressed air may be formed on the upper surface of the temperature stabilizing unit 100. The compressed air provider 102 may provide compressed air to the wafer 10 on the temperature stabilizing unit 100 to cool (or otherwise control the) temperature of the wafer 10 to an appropriate level. The compressed air provider 102 may be connected to the compressed air generator 103 through a compressed air tube. The compressed air generated from the compressed air generator 103 may be provided to the wafer 10 through the compressed air tube.

A vacuum provider 104 may be on the top surface of the temperature stabilizing unit 100 and may provide a vacuum to suction the compressed air provided by the compressed air provider 102. The vacuum provider 104 may provide a vacuum to the wafer 10 on the temperature stabilizing unit 100 to suction the compressed air from the compressed air provider 102. The vacuum provider 104 may be connected to the vacuum generator 105 through a vacuum tube. The compressed air from the compressed air provider 102 may be sucked into the vacuum generator 105 through the vacuum provider 104 and the vacuum tube by the vacuum generated by the vacuum generator 105.

The compressed air generator 103 may generate compressed air and may be connected to the compressed air provider 102 to provide the compressed air to the compressed air provider 102. The wafer 10 may be cooled by the compressed air, and pressure of the compressed air may be determined based on the temperature of the wafer 10 and/or other predetermined factors. The compressed air generator 103 may generate compressed air in a predetermined range, e.g., about 50 kPa to 150 kPa (kilopascals). In one embodiment, the compressed air generator 103 may generate compressed air at about 100 kPa (kilopascals)±500 Pa (pascals). The pressures represent relative pressures to atmospheric pressure around the semiconductor manufacturing apparatus.

The vacuum generator 105 may be connected to the vacuum provider 104 to provide a vacuum to the vacuum provider 104. The compressed air from the compressed air provider 102 may be suctioned by the vacuum, and vacuum pressure of the vacuum may be determined based on the pressure of the compressed air of the compressed air generator 103 and/or other predetermined factors. The vacuum pressure may be in a predetermined range, e.g., about −5 kPa to −25 kPa. In one embodiment, the vacuum pressure may be about −12 kPa±3 kPa. The pressures may represent pressures relative to atmospheric pressure around the semiconductor manufacturing apparatus.

A pressure sensor 120 may be installed in the vacuum tube between the vacuum generator 105 and the vacuum provider 104. The pressure sensor 120 may measure pressure in the vacuum tube and may be directly below the temperature stabilizing unit 100 in which the vacuum provider 104 is formed. The pressure sensor 120 may be under the temperature stabilizing unit 100 in a third direction D3, which is perpendicular to a plane which is formed by a first direction D1 and a second direction (e.g., D2 of FIG. 2) and in which the wafer 10 is disposed. The pressure sensor 120 may be electrically connected to the controller 150, measure the pressure in the vacuum tube, and provide a corresponding pressure sensor signal to the controller 150.

For example, the pressure sensor 120 may be a pressure sensor chip of a diaphragm type, a semiconductor pressure sensor of a pressure sensing circuit on the membrane, or another type. The pressure sensor 120 may measure the pressure of the vacuum tube and provide a corresponding pressure sensor signal to the controller 150 which operates based on information corresponding to the pressure.

The controller 150 may determine whether or not the wafer 10 is in a proper position on the temperature stabilizing unit 100 based on the proximity sensor signal from the proximity sensor 110 and the pressure sensor signal from the pressure sensor 120. Accordingly, when the temperature stabilizing unit 100 approaches the wafer 10 in a predetermined range, the actuator 200 is operated to adjust the distance between the wafer 10 and the temperature stabilizing unit 100 in order to maintain the distance in an appropriate range.

In one embodiment, the relative position between a lower surface of the wafer 10 and an upper surface of the temperature stabilizing unit 100 may be determined based on the proximity sensor signal and the pressure sensor signal from the proximity sensor 110 and the pressure sensor 120. Based on this relative position, a portion of the lower surface of the wafer 10 which approaches too closely to the upper surface of the temperature stabilizing unit 100 may be found, and the portion of the temperature stabilizing unit 100 may be moved using the actuator 200 so that the portion of the temperature stabilizing unit 100 is disposed in appropriate position.

The actuator 200 may move the position of the temperature stabilizing unit 100. In one embodiment, the actuator 200 may be driven to tilt the temperature stabilizing unit 100 and/or raise or lower the height of a specific portion of temperature stabilizing unit 100. For example, the actuator 200 may include a first actuator (e.g., refer to 200a of FIG. 3), a second actuator (e.g., refer to 200b of FIG. 3), and a third actuator (e.g., refer to 200c of FIG. 3) along edge of the temperature stabilizing unit 100. The first to third actuators may be individually controlled by the controller 150 to adjust the distance between the temperature stabilizing unit 100 and the wafer 10. Accordingly, the distance between the wafer 10 and the temperature stabilizing unit 100 may be corrected in real time in an appropriate range. Thus, a scratch on the wafer 10 (which otherwise may be formed based on contact with the temperature stabilizing unit 100) may be prevented, and a decrease in the cooling effect of the wafer 10 due to the wafer 10 being excessively separated from the temperature stabilizing unit 100 may be prevented.

The chuck 300 may support a center of the wafer 10 through a center of the temperature stabilizing unit 100. The chuck 300 may be connected to and rotated by the chuck driver 310. Accordingly, the wafer 10 supported by the chuck 300 may be rotated. For example, the chuck 300 may be a porous chuck for holding the wafer 10 by a vacuum suction force or an electrostatic chuck including a metal electrode or a pair of electrodes for causing a voltage difference with the wafer 10.

The chuck driver 310 may be connected and rotate the chuck 300. The chuck driver 310 may drive the chuck 300 and rotate the wafer 10 in order to perform pre-alignment, while the wafer 10 is cooled by the compressed air.

The edge sensor part 400 may include a sensor at one side of the temperature stabilizing unit 100 to sense a position of the wafer 10. As the edge sensor part 400 senses the position of the wafer 10, the wafer 10 is moved using a centering device to align a center position of the wafer 10, so that pre-alignment process may be performed.

The sensor may include, for example, a light source 410 and a light sensor 420, which senses the edge based on light from the light source 410. The light sensor 420 may receive the light from the light source 410 and sense the position of the wafer 10. The wafer 10 is rotated by the chuck 300 so that a notch portion (such as a notch or an orientation flat previously formed at the edge of the wafer 10) is detected. Based on this detection, the centering device may align the position of the wafer 10 (e.g., perform a centering process).

In order to manufacture a semiconductor apparatus, an exposure process using an exposure apparatus may be performed for the wafer 10 on which a photoresist layer is formed. To do this, a pre-alignment process may be performed to pre-align the position of the wafer 10 after the photoresist layer is formed on the wafer 10 and before the exposure process. At this time, the semiconductor manufacturing apparatus according to the embodiments described herein may be used. The wafer 10 may be pre-aligned using the semiconductor manufacturing apparatus, and a temperature control process for lowering the temperature of the wafer 10 to an appropriate temperature may be performed at the same time.

As described above, the pre-alignment process may be performed such that the edge sensor part 400 senses the notch portion of the edge of the wafer 10 while the wafer 10 is rotating. The position of the wafer 10 may be aligned based on the sensed notch portion using the centering device.

According to the present embodiment, when the wafer 10 is rotating, it may be excessively close to the temperature stabilizing unit 100 to cause a scratch on the wafer 10, or the wafer 10 may be excessively spaced from the temperature stabilizing unit 100 so that cooling efficiency may be lowered. To prevent these problems, the distance between the wafer 10 and the temperature stabilizing unit 100 may be maintained in a predetermined range using the proximity sensor 110, the pressure sensor 120, the controller 150, and the actuator 200.

While the wafer 10 is being pre-aligned, the compressed air provider 102 of the temperature stabilizing unit 100 may, at the same time, provide the compressed air to the wafer 10 to cool the wafer 10 to an appropriate temperature. For example, when the photoresist layer is formed on the wafer 10 before the wafer 10 is loaded on the semiconductor manufacturing apparatus, the temperature of the wafer 10 may rise. Accordingly, the temperature of the wafer 10 may be cooled before an exposure process.

Since the pre-alignment process and temperature control (cooling) process are performed at the same time, the process time of the semiconductor manufacturing process may be shortened and efficient production may be achieved.

Figure 2:
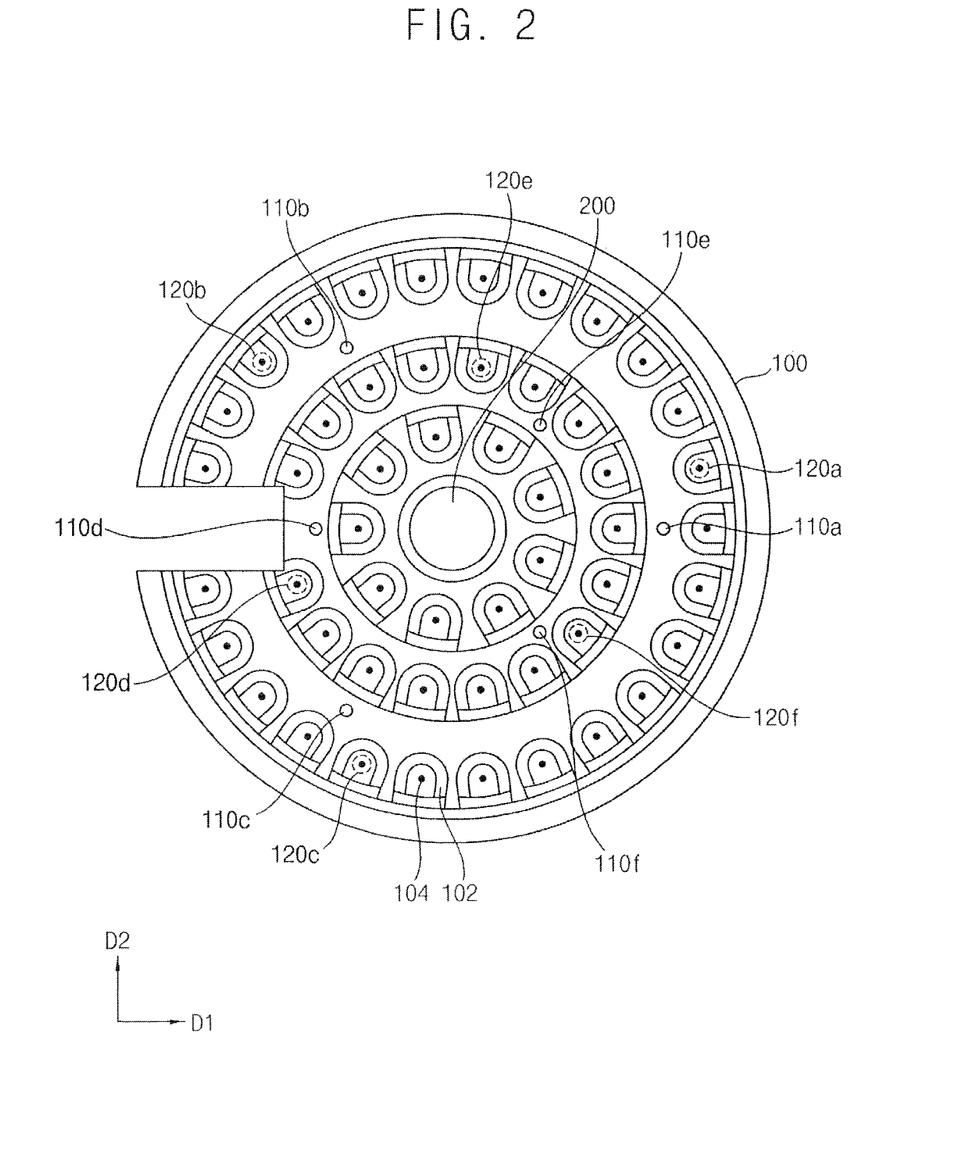
FIG. 2 illustrates an embodiment of a temperature stabilizing unit.

FIG. 2 illustrates an embodiment of a temperature stabilizing unit, which, for example, may be included in the semiconductor manufacturing apparatus in FIG. 1.

Referring to FIG. 2, a plurality of compressed air provider 102 and vacuum providers 104 may be on an upper surface of the temperature stabilizing unit 100. In one embodiment, the compressed air providers 102 and the vacuum providers 104 may be arranged in a uniform pattern on the upper surface of the temperature stabilizing unit 100. For example, the compressed air providers 102 and the vacuum provider 104 may be alternately arranged concentrically on the upper surface of the temperature stabilizing unit 100.

A proximity sensor may be on the upper surface of the temperature stabilizing unit 100. The proximity sensor may include a first proximity sensor 110*a*, a second proximity sensor 110*b*, a third proximity sensor 110*c*, a fourth proximity sensor 110*d*, a fifth proximity sensor 110*e*, and a sixth proximity sensor 110*f*. The first proximity sensor 110*a*, the second proximity sensor 110*b*, and the third proximity sensor 110*c* may be arranged in a predetermined (e.g., triangular) shape having a center coinciding with the center of the temperature stabilizing unit 100.

The fourth proximity sensor 110*d*, fifth proximity sensor 110*e*, and sixth proximity sensor 110*f* may also be arranged in a predetermined (e.g., triangular) shape having a center coinciding with the center of the temperature stabilizing unit 100. The size and arrangement direction of the triangle formed by the fourth proximity sensor 110*d*, the fifth proximity sensor 110*e* and the sixth proximity sensor 110*f* may be different from size and arrangement direction of the triangle formed by the first proximity sensor 110*a*, the second proximity sensor 110*b*, and the third proximity sensor 110*c*. Accordingly, the distance between the wafer (e.g., see 10 in FIG. 1) and the temperature stabilizing unit 100 at respective positions may be more accurately measured using the first to sixth proximity sensors 110*a*, 110*b*, 110*c*, 110*d*, 110*e*, and each position may be more accurately sensed.

The temperature stabilizing unit 100 may include a plurality of pressure sensors. The pressure sensor may include a first pressure sensor 120*a*, a second pressure sensor 120*b*, a third pressure sensor 120*c*, a fourth pressure sensor 120*d*, a fifth pressure sensor 120*e*, and a sixth pressure sensor 120*f*. The first pressure sensor 120*a*, the second pressure sensor 120*b* and the third pressure sensor 120*c* may be arranged in a predetermined (e.g., triangular) shape having a center coinciding with the center of the temperature stabilizing unit 100.

In addition, the fourth pressure sensor 120*d*, fifth pressure sensor 120*e*, and sixth pressure sensor 120*f* may be arranged in a predetermined (e.g., triangular) shape having a center coinciding with the center of the temperature stabilizing unit 100. The size and arrangement direction of the triangle formed by the fourth pressure sensor 120*d*, fifth pressure sensor 120*e*, and sixth pressure sensor 120*f* may be different from size and arrangement direction of the triangle formed by the first pressure sensor 120*a*, second pressure sensor 120*b*, and third pressure sensor 120*c*. Accordingly, using the first to sixth pressure sensors 120a, 120b, 120c, 120d, 120e, and 120f, it is possible to more accurately sense the pressure corresponding to respective positions of the wafer 10.

Six proximity sensors and six pressure sensors are in the temperature stabilizing unit 100 in the present embodiment. A different number of proximity sensors and/or the pressure sensors may be arranged in another embodiment.

Figure 3:
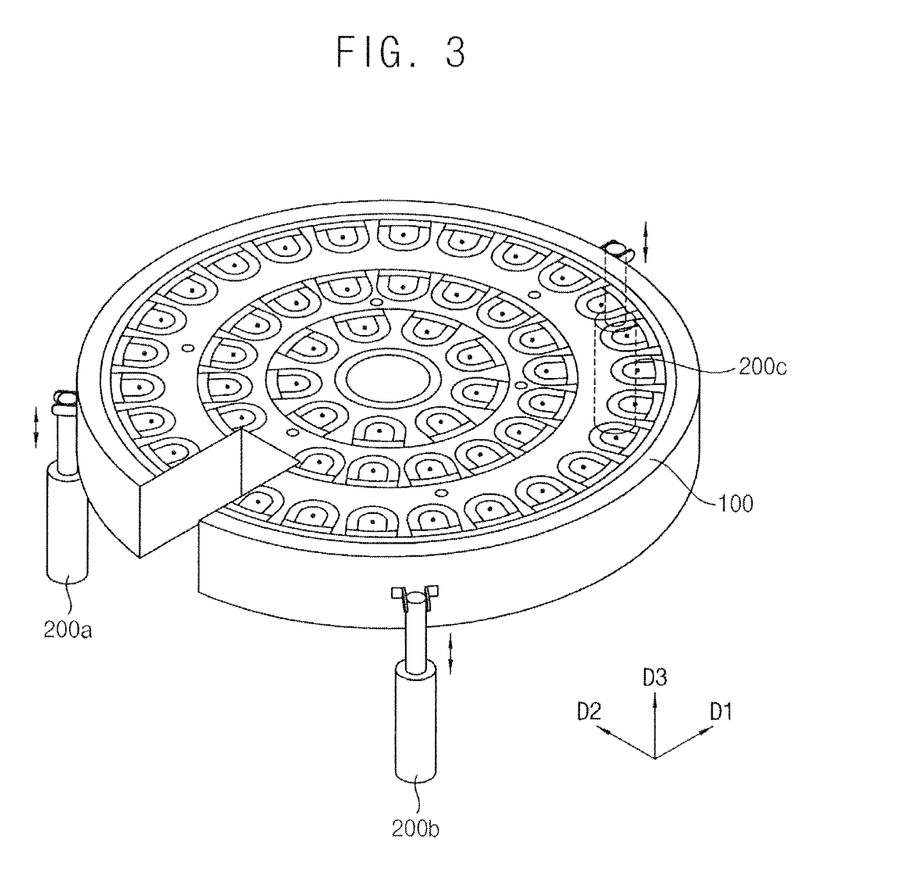
FIG. 3 illustrates operations of the temperature stabilizing unit and first to third actuators according to an embodiment.

FIG. 3 illustrating operations of the temperature stabilizing unit and first to third actuators of the semiconductor manufacturing apparatus in FIG. 1 according to an embodiment.

Referring to FIG. 3, the first actuator 200a, the second actuator 200b, and the third actuator 200c may be connected to the temperature stabilizing unit 100 along the edge of the temperature stabilizing unit 100 of the semiconductor manufacturing apparatus. The first to third actuators 200a, 200b, and 200c may move the temperature stabilizing unit 100. For example, the actuator 200 may be driven to tilt the temperature stabilizing unit 100 and/or raise or lower the height of a specific portion of temperature stabilizing unit 100. The first to third actuators may be individually controlled by the controller (e.g., refer to 150 of FIG. 1) to adjust the distance between the temperature stabilizing unit 100 and the wafer 10.

The first to third actuators 200a, 200b, and 200c may be linear actuators that may linearly move using electric, hydraulic, compressed air, or the like. For example, the linear actuator may be a solenoid actuator using a magnetic field.

In the present embodiment, the temperature stabilizing unit 100 is described as being moved by three actuators. A different number of actuators controlled by the controller 150 may be placed in proper places to move the temperature stabilizing unit 100 in another embodiment.

Figure 4A:
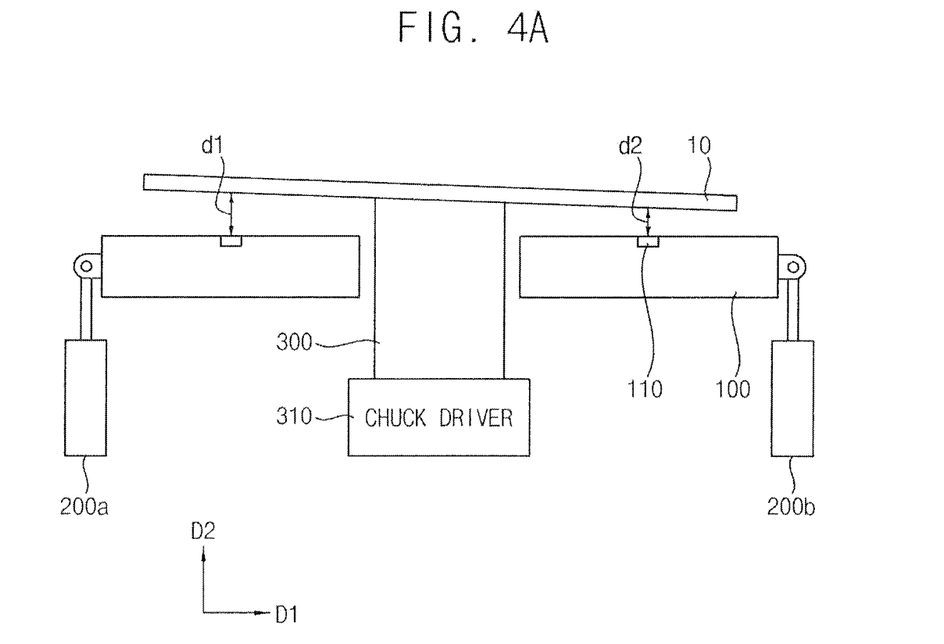
FIGS. 4A and 4B illustrate embodiments for performing positional correction of a temperature stabilizing unit based on distance.
Figure 4B:
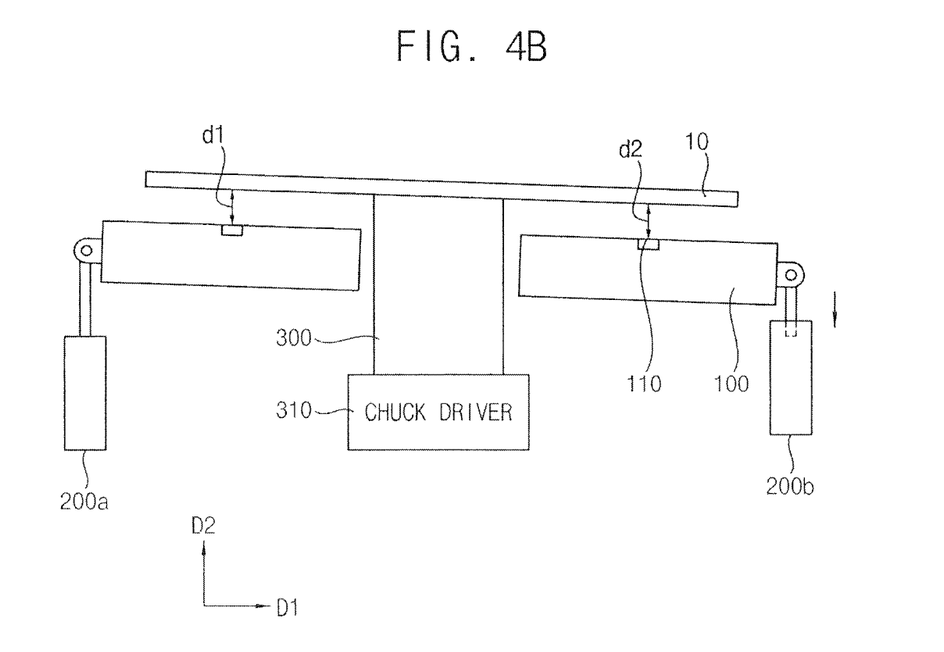

FIGS. 4A and 4B illustrate cross-sectional views of embodiments for performing positional correction of a temperature stabilizing unit according to distance.

Referring to FIG. 4A, a wafer 10 may be rotated while a chuck 300 is rotated by the chuck driver 310 and is supported by the chuck 300. A proximity sensor 110 of the temperature stabilizing unit 100 may measure the distance between the wafer 10 and the temperature stabilizing unit 100 at a plurality of points. In FIG. 4A, a second distance d2 between the temperature stabilizing unit 100 and the wafer 10 at a second point and the wafer 10 is less than a first distance d1 between the temperature stabilizing unit 100 and the wafer 10 at the first point and the wafer 10. This may occur when the distance between the temperature stabilizing unit 100 and the wafer 10 is not uniform due to twisting of the wafer 10 or when the wafer 10 is entirely inclined relative to the temperature stabilizing unit 100.

When the first distance d1 is in a predetermined range and the second distance d2 is out of the predetermined range, the actuators 200a and 200b may move the temperature stabilizing unit 100 to correct the position of the temperature stabilizing unit 100 based on operation of the controller (e.g., refer to 200 of FIG. 1).

Referring to FIG. 4B, the height of the first actuator 200a is maintained as it is and the height of the second actuator 200b is lowered so that the second actuator 200b is moved in a direction opposite to a third direction D3. The distance between the temperature stabilizing unit 100 and the wafer 10 at the second point may be increased. Thus, the second distance d2 may be in the predetermined range.

According to the present embodiment, when the distance between the wafer 10 and the temperature stabilizing unit 100 is increased and out of the predetermined range, the first and second actuators 200a and 200b may be properly operated by the controller to correct the distance between the wafer 10 and the temperature stabilizing unit 100 to within the predetermined range. Since the correction is performed in real time by the proximity sensor 110, the controller 150, and the actuators 200a and 200b, the distance between the temperature stabilizing unit 100 may be continuously corrected while the semiconductor manufacturing apparatus is driven.

The predetermined range may be, for example, about 17 μm (micrometers) to about 43 μm. In one embodiment, the predetermined range may be about 25 μm to 35 μm. Although the wafer 10 is shown as being tilted on the drawing, when the wafer 10 gets partially closer to the temperature stabilizing unit 100 as a result of twisting of the wafer 10, the position of the temperature stabilizing unit 100 may be corrected in a similar way.

Figure 5A:
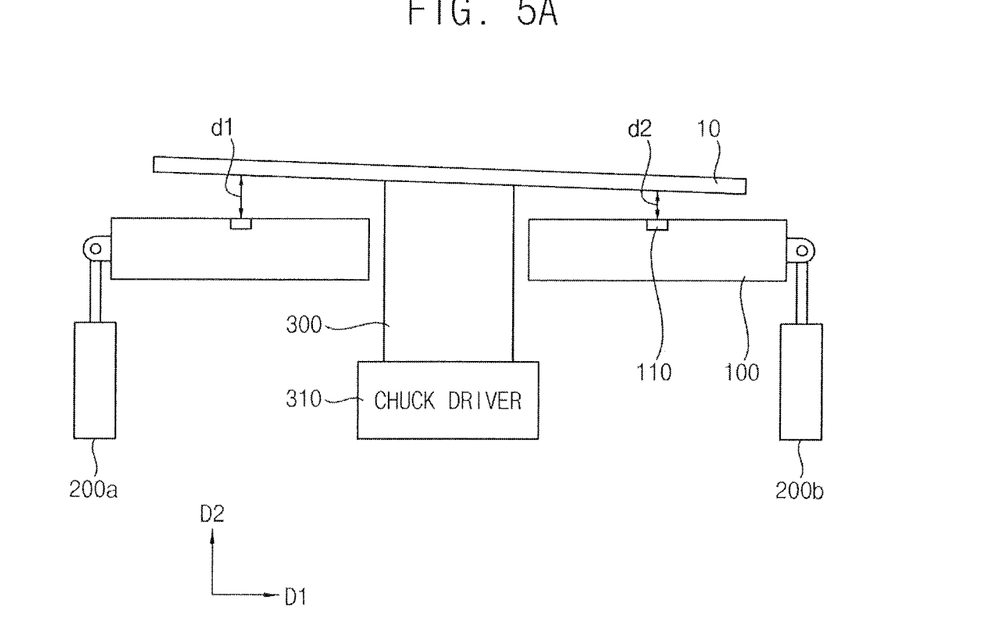
FIGS. 5A and 5B illustrate additional embodiments for performing positional correction of a temperature stabilizing unit based on distance.
Figure 5B:
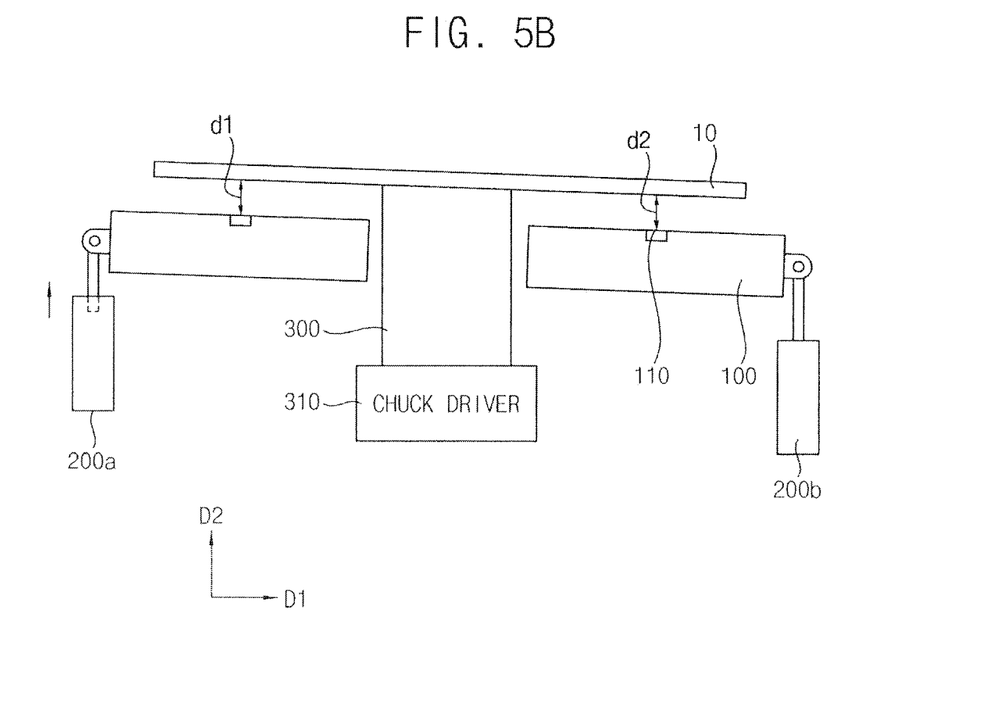

FIGS. 5A and 5B illustrate cross-sectional views of additional embodiments for performing positional correction of a temperature stabilizing unit according to distance.

Referring to FIG. 5A, the wafer 10 supported by the chuck 300 may be rotated by rotation of the chuck 300, which is rotated by the chuck driver 310. At this time, a proximity sensor 110 of the temperature stabilizing unit 100 may measure the distance between the wafer 10 and the temperature stabilizing unit 100 at a plurality of points. In FIG. 5A, a first distance D1 between the temperature stabilizing unit 100 and the wafer 10 at a first point is greater than a second distance D2 between the temperature stabilizing unit 100 and the wafer 10 at a second point. This may occur when the distance between the temperature stabilizing unit 100 and the wafer 10 is not uniform due to twisting of the wafer 10 or when the wafer 10 is entirely inclined relative to the temperature stabilizing unit 100.

When the second distance D2 is in a predetermined range and the first distance d1 is out of the predetermined range, the actuators 200a and 200b may move the temperature stabilizing unit 100 to correct the position of the temperature stabilizing unit 100 based on operation of the controller.

Referring to FIG. 5B, the height of the second actuator 200b is maintained as it is and the height of the first actuator 200a is increased so that the first actuator 200a is moved in a third direction D3. The distance between the temperature stabilizing unit 100 and the wafer 10 at the first point may be decreased. Thus, the first distance d1 may be in the predetermined range.

According to the present embodiment, when the distance between the wafer 10 and the temperature stabilizing unit 100 is increased and out of the predetermined range, the first and second actuators 200a and 200b may be properly operated by the controller to correct the distance between the wafer 10 and the temperature stabilizing unit 100 to within the predetermined range. Since the correction is performed in real time by the proximity sensor 110, the controller 150, and the actuators 200a and 200b, the distance between the temperature stabilizing unit 100 may be continuously corrected while the semiconductor manufacturing apparatus is driven.

The predetermined range may be, for example, about 17 μm (micrometers) to about 43 μm. Preferably, the predetermined range may be about 25 μm to 35 μm. Although the wafer 10 is shown as being tilted on the drawing, when the wafer 10 gets partially closer to the temperature stabilizing unit 100 by twisting of the wafer 10, the position of the temperature stabilizing unit 100 may be corrected in a similar way.

Figure 6A:
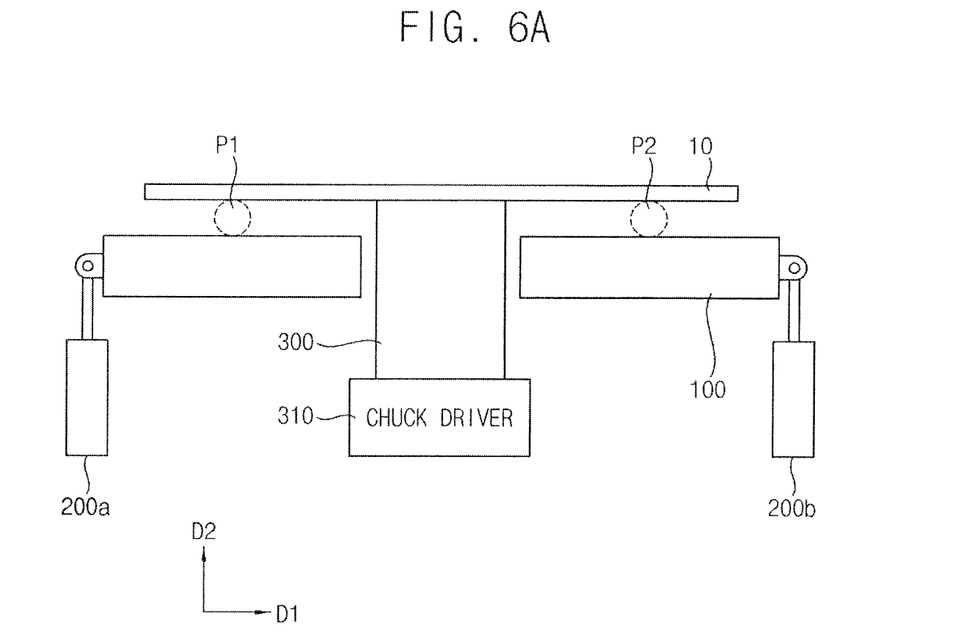
FIGS. 6A and 6B illustrate embodiments for performing positional correction of a temperature stabilizing unit based on pressure.
Figure 6B:
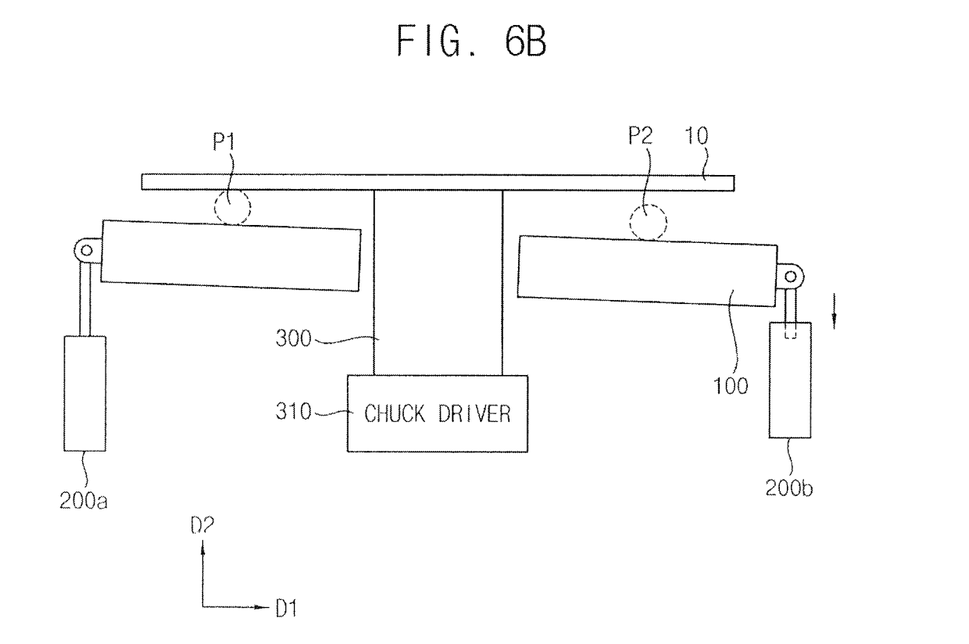

FIGS. 6A and 6B illustrate cross-sectional views of additional embodiments for performing positional correction of a temperature stabilizing unit according to pressure.

Referring to FIG. 6A, the wafer 10 supported by the chuck 300 may be rotated by rotation of the chuck 300, which is rotated by the chuck driver 310. At this time, using a pressure sensor (e.g., refer to 120 of FIG. 1), pressure may be measured at multiple points. As described in FIG. 1, the pressure may be measured in the vacuum tube between the vacuum provider (e.g. refer to 104 in FIG. 1) and the vacuum generator (e.g., refer to 105 in FIG. 1). When the pressure sensor 120 is between the wafer 10 and the temperature stabilizing unit 100, it may be difficult to measure correct pressure by compressed air generated from a compressed air generator 103. Thus, the pressure sensor may be disposed between the vacuum provider and the vacuum generator.

In FIG. 6A, the second pressure P2 (which is the pressure at the second point) is less than the first pressure P1 (which is the pressure at the first point). This may occur when the distance between the temperature stabilizing unit 100 and the wafer 10 is not uniform due to twisting of the wafer 10, when the wafer 10 is entirely inclined relative to the temperature stabilizing unit 100, or when the pressure between the wafer 10 and the temperature stabilizing unit 100 is unstable.

When the first pressure P1 is in a predetermined range and the second pressure P2 is out of the predetermined range, the actuators 200a and 200b may move the temperature stabilizing unit 100 to correct the position of the temperature stabilizing unit 100 by operation of the controller.

Referring to FIG. 6B, the height of the first actuator 200a is maintained as it is and the height of the second actuator 200b is lowered so that the second actuator 200b is moved in a direction opposite to a third direction D3. The distance between the temperature stabilizing unit 100 and the wafer 10 at the second point may be increased. As a result, a scratch on a lower surface of the wafer 10 (that otherwise may occur by contact with the temperature stabilizing unit 100 due to excessively lowered the pressure at the second portion) may be prevented.

According to the present embodiment, when the distance between the wafer 10 and the temperature stabilizing unit 100 is decreased by excessive pressure drop between the wafer 10 and the temperature stabilizing unit 100, the first and second actuator 200a and 200b may be properly operated by the controller to correct the distance between the wafer 10 and the temperature stabilizing unit 100. Since the correction is performed in real time by the pressure sensor 120, the controller 150, and the actuators 200a and 200b, the distance between the temperature stabilizing unit 100 may be continuously corrected while the semiconductor manufacturing apparatus is driven.

The control unit may be driven so that the pressure which is measured by the pressure sensor is maintained in a predetermined range. The predetermined range of the pressure may be, for example, about −5 kPa to −25 kPa. In one embodiment, the predetermined range of the pressure may be about −12 kPa±3 kPa. Although the wafer 10 is shown as being tilted on the drawing, when the wafer 10 gets partially closer to the temperature stabilizing unit 100 by twisting of the wafer 10, the position of the temperature stabilizing unit 100 may be corrected in a similar way.

Figure 7A:
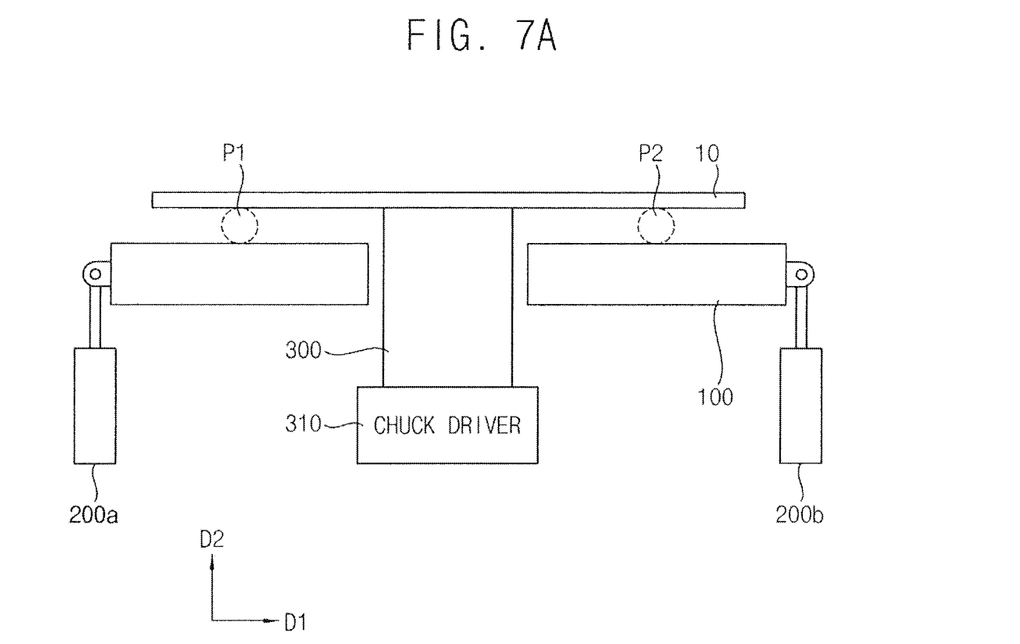
FIGS. 7A and 7B illustrate additional embodiments for performing positional correction of a temperature stabilizing unit based on pressure.
Figure 7B:
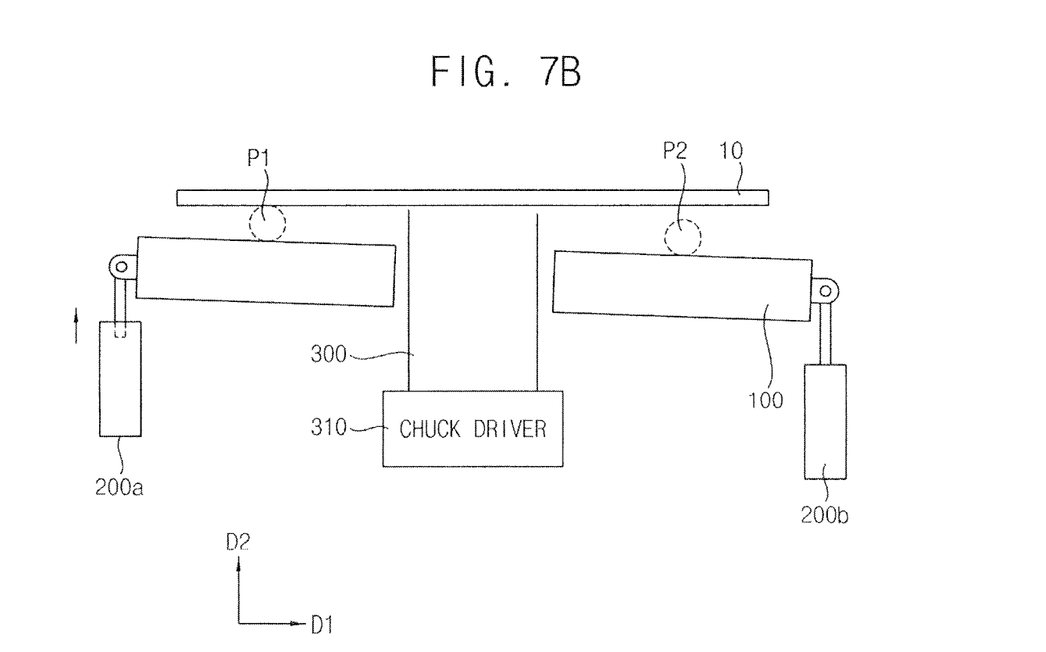

FIGS. 7A and 7B illustrate cross-sectional views of additional embodiments for performing positional correction of a temperature stabilizing unit according to pressure.

Referring to FIG. 7A, the wafer 10 may be rotated as the chuck 300 is rotated by the chuck driver 310, while being supported by the chuck 300. At this time, the pressure may be measured at a plurality of points by the pressure sensors of the temperature stabilizing unit 100 (e.g., refer to 120 of FIG. 1).

In FIG. 7A, the first pressure P1 (which is the pressure at the first point) is greater than the first pressure P1 (which is the pressure at the first point). This may occur when the distance between the temperature stabilizing unit 100 and the wafer 10 is not uniform due to twisting of the wafer 10, when the wafer 10 is entirely inclined relative to the temperature stabilizing unit 100, or when the pressure between the wafer 10 and the temperature stabilizing unit 100 is unstable.

When the second pressure P2 is in a predetermined range and the first pressure P1 is out of the predetermined range, the actuators 200a and 200b may move the temperature stabilizing unit 100 to correct the position of the temperature stabilizing unit 100 by operation of the controller.

Referring to FIG. 7B, the height of the second actuator 200b is maintained as it is and the height of the first actuator 200b is increased that the second actuator 200b is moved in a third direction D3. The distance between the temperature stabilizing unit 100 and the wafer 10 at the first point may be decreased. As a result, a decrease of the cooling effect to the wafer 10 (resulting from being excessively moved away from the temperature stabilizing unit 100 due to excessively increased pressure at the second portion) may be prevented.

According to the present embodiment, when the distance between the wafer 10 and the temperature stabilizing unit 100 is increased by excessive high pressure between the wafer 10 and the temperature stabilizing unit 100, the first and second actuators 200a and 200h may be properly operated by the controller to correct the distance between the wafer 10 and the temperature stabilizing unit 100. Since the correction is performed in real time by the pressure sensor, the controller 150, and the actuators 200a and 200b, the distance between the temperature stabilizing unit 100 may be continuously corrected while the semiconductor manufacturing apparatus is driven.

The control unit may be driven so that the pressure which is measured by the pressure sensor may be maintained in a predetermined range. The predetermined range of the pressure may be, for example, about −5 kPa to −25 kPa. In one embodiment, the predetermined range of the pressure may be about −12 kPa+/−3 kPa.

The operation of the actuators 200a and 200b is performed only in a range in which the distance between the temperature stabilizing unit 100 and the wafer 10 is in the predetermined range. (e.g., see the embodiment of FIGS. 5A to 6B). Thus, the position of the temperature stabilizing unit 100 is corrected based on the pressure measured by the pressure sensor. The correction may be performed only in a range such that the distance between the temperature stabilizing unit 100 and the wafer 10 is in the predetermined range of, for example, about 17 um (micrometers) to about 43 um (in one embodiment, about 25 um to about 35 um).

Although the wafer 10 is shown as being tilted, when the wafer 10 gets partially closer to the temperature stabilizing unit 100 by twisting of the wafer 10, the position of the temperature stabilizing unit 100 may be corrected in a similar way.

Referring to FIG. 4A to 7B, the semiconductor manufacturing apparatus according to the present embodiments may correct the position of the temperature stabilizing unit 100 based on the distance between the temperature stabilization unit 100 and the wafer 10 or based on the measured pressure.

In one embodiment, correction based on the distance and correction based on the measured pressure may be applied in combination to correct the position of the temperature stabilizing unit 100. For example, the semiconductor manufacturing apparatus may correct the position of the temperature stabilizing unit 100 by a correction based on the distance. At the same time, the position of the temperature stabilizing unit 100 is corrected by the correction based on the measured pressure. The temperature stabilizing unit 100 may be moved only in a predetermined range so that the distance between the wafer 10 and the temperature stabilizing unit 100 is adjusted in the predetermined range.

Figure 8:
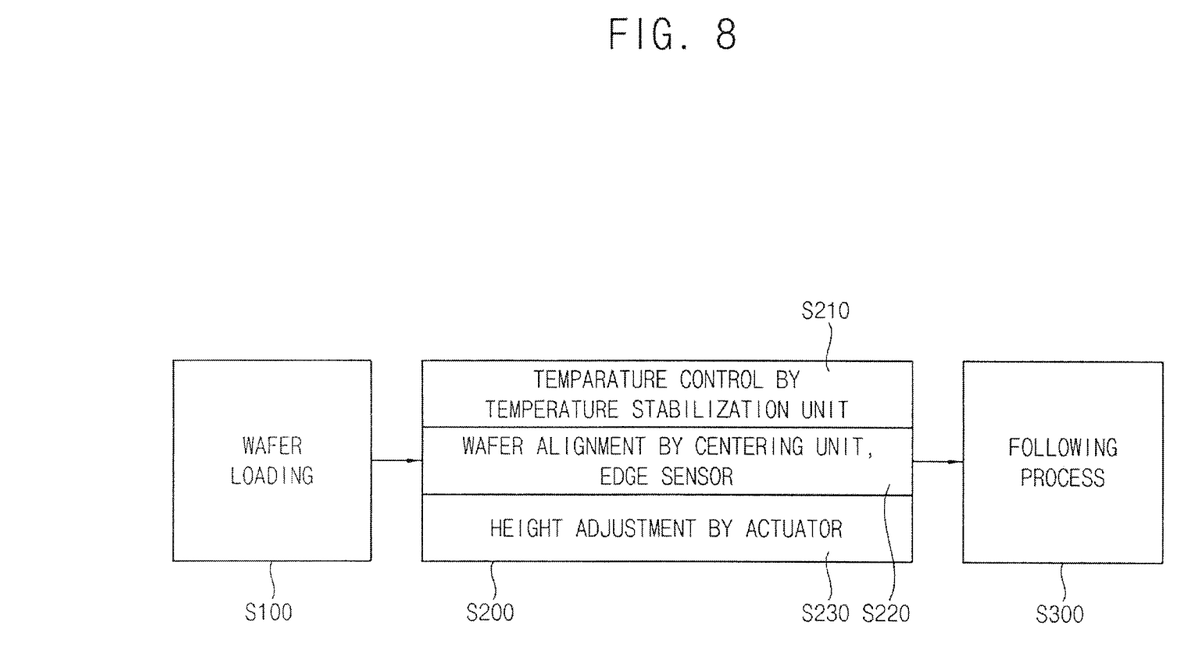
FIG. 8 illustrates an embodiment of a method for driving a semiconductor manufacturing apparatus.

FIG. 8 illustrates an embodiment of a method for driving a semiconductor manufacturing apparatus. Referring to FIG. 8, the method may include an operation for wafer loading S100, an operation for wafer cooling and pre-alignment S200, and a following process S300.

The semiconductor manufacturing apparatus may include a temperature stabilizing unit (or temperature stabilizer) 100 (e.g., refer to 100 of FIG. 1), a compressed air generator (e.g., refer to 103 of FIG. 1), a vacuum generator (e.g., refer to 105 of FIG. 1), a proximity sensor (e.g., refer to 110 of FIG. 1), a pressure sensor (e.g., refer to 120 of FIG. 1), a controller (e.g., refer to 150 of FIG. 1), an actuator (e.g., refer to 200 of FIG. 1), a chuck (e.g., refer to 300 of FIG. 1), and a chuck driver (e.g., refer to 310 of FIG. 1).

In the operation of wafer loading S100, a wafer may be loaded on the semiconductor manufacturing apparatus. For example, the wafer may be loaded on the chuck of the semiconductor manufacturing apparatus. In addition, a photoresist layer may be formed on the wafer before the wafer is loaded on the chuck. The photoresist layer may be formed by a method such as spin coating or another method. At this time, the temperature of the wafer may be cooled for an exposure process, which is a following process, as the temperature of the wafer rises.

In the operation of wafer cooling and pre-alignment S200, pre-alignment of the wafer for the exposure process may be performed at the same time as the wafer is cooled. For example, the compressed air provider may provide compressed air to the wafer on the temperature stabilizing unit to cool the wafer to an appropriate temperature. The compressed air provider may be connected to the compressed air generator through a compressed air tube. The compressed air generated from the compressed air generator may be provided to the wafer through the compressed air provider and the compressed air tube. (S210).

In addition, the wafer 10 may be rotated by the chuck so that a notch portion (such as a notch or an orientation flat previously formed at an edge of the wafer 10) is detected. Based on this detection, a centering unit may align the position of the wafer 10 (centering process). Accordingly, the pre-alignment process may be performed. The temperature stabilizing unit may be moved using the actuator of the semiconductor manufacturing apparatus, so that the distance between the wafer and the temperature stabilizing unit may be controlled in real time to be in a predetermined range. (S220).

In one embodiment, three or more of the proximity sensors may be installed on an upper surface of the temperature stabilizing unit 100 to measure the distance between the wafer and the temperature stabilizing unit at a plurality of points. The temperature stabilizing unit may be moved using the actuator, so that the distance between the wafer and the temperature stabilizing unit may be controlled in the predetermined range. (S230).

The pressure sensor may be installed in a vacuum tube between the vacuum generator and the vacuum generator. The pressure sensor may measure pressure in the vacuum tube and may provide a corresponding pressure sensor signal to the controller. The controller may operate the actuator to move the temperature stabilizing unit based on the pressure sensor signal for a portion where the measured pressure is judged to be out of a predetermined range, so that the measured pressure is in the predetermined range.

The compressed air generator may generate compressed air in a predetermined range, e.g., at about 50 kPa to 150 kPa (kilopascals). In one embodiment, the compressed air generator may generate compressed air at about 100 kPa (kilopascals)+500 Pa (pascals). The vacuum pressure may be in a predetermined range, e.g., about −5 kPa to −25 kPa. In one embodiment, the predetermined range of the vacuum pressure may be about −12 kPa 3 kPa. The pressures may represent relative pressures to atmospheric pressure around the semiconductor manufacturing apparatus. The predetermined range of the distance between the temperature stabilizing unit 100 and the wafer 10 may be, for example, about 17 um (micrometers) to about 43 um (in one embodiment, about 25 um to about 35 um).

In the following process S300, following processes may be performed. For example, the photoresist layer of the wafer may be subjected to an exposure process using exposure equipment for semiconductor manufacturing. At this time, because the wafer has already been cooled to appropriate temperature and the wafer has been pre-aligned, efficiency of semiconductor manufacturing process may be improved.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, drivers, and other signal generating and signal processing features of the embodiments disclosed herein may be implemented in non-transitory logic which, for example, may include hardware, software, or both. When implemented at least partially in hardware, the controllers, drivers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, the semiconductor manufacturing apparatus and the driving method of the semiconductor manufacturing apparatus may be applied to the manufacture of semiconductors such as but not limited to memory devices and logic devices.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor manufacturing apparatus, comprising:
a temperature stabilizer on a plane defined by a first direction and a second direction crossing the first direction;
a chuck to support and rotate a wafer in a position spaced apart from the temperature stabilizer in a third direction, the third direction crossing the first and second directions, the chuck passing through a center of the temperature stabilizer;
an actuator system, connected to the temperature stabilizer, to move the temperature stabilizer in the third direction;
a controller to control driving of the actuator system such that the actuator system moves the temperature stabilizer to change a distance, in the third direction, between the wafer and the temperature stabilizer;
a compressed air provider formed as at least one opening at an upper surface of the temperature stabilizer, to provide compressed air to the wafer;
a vacuum provider formed as at least one opening at the upper surface, to provide a vacuum to suction the compressed air from the compressed air provider; and
a pressure sensor to measure a pressure in a vacuum tube that is connected to the vacuum provider, generate a corresponding pressure sensor signal, and provide the pressure sensor signal to the controller, wherein
the actuator system includes a first actuator, a second actuator, and a third actuator disposed along an edge of the temperature stabilizer, and
the first, second, and third actuators are to adjust and tilt the plane of the temperature stabilizer, at an angle and distance in a predetermined range, relative to a plane of the wafer,
wherein the controller is to operate the actuator system to change the distance between the wafer and the temperature stabilizer based on the pressure sensor signal, the actuator system to move the temperature stabilizer to correct a position of the temperature stabilizer such that the distance between the wafer and the temperature stabilizer is in the predetermined range when the distance between the wafer and the temperature stabilizer is out of the predetermined range.

2. The apparatus as claimed in claim 1, further comprising:
at least one proximity sensor on an upper surface of the temperature stabilizer, wherein the at least one proximity sensor is to measure the distance between the wafer and the temperature stabilizer, and is to provide a corresponding proximity sensor signal to the controller.

3. The apparatus as claimed in claim 2, wherein the at least one proximity sensor includes a plurality of the proximity sensors, at least three of the proximity sensors arranged in a triangular shape.

4. The apparatus as claimed in claim 2, wherein the controller is to operate the actuator system to change the distance between the wafer and the temperature stabilizer based on the proximity sensor signal, the actuator system to move the temperature stabilizer to correct the position of the temperature stabilizer such that the distance between the wafer and the temperature stabilizer is in the predetermined range when the distance between the wafer and the temperature stabilizer is out of the predetermined range.

5. The apparatus as claimed in claim 1, further comprising:
an edge sensor, at one side of the temperature stabilizer, to sense a position of the wafer.

6. A method for driving a semiconductor manufacturing apparatus that includes a chuck to support and rotate a wafer and a temperature stabilizer spaced apart from the wafer, the method comprising:
(a) determining a distance between the wafer on the chuck and the temperature stabilizer;
(b) controlling an actuator system coupled to the temperature stabilizer to align the wafer relative to the temperature stabilizer by moving the temperature stabilizer to change the distance between the wafer and the temperature stabilizer while simultaneously cooling the wafer using the temperature stabilizer; and
(c) performing a process on the cooled and aligned wafer,
wherein (b) includes moving the temperature stabilizer using the actuator system to control the distance between the wafer and the temperature stabilizer to be in a predetermined range, wherein: the actuator system includes a first actuator, a second actuator, and a third actuator along an edge of the temperature stabilizer, and
(b) includes operating the first, second, and third actuators to adjust a tilt of a plane of the temperature stabilizer at a predetermined angle relative to a plane of the wafer,
wherein:
the semiconductor manufacturing apparatus includes at least one proximity sensor on an upper surface of the temperature stabilizer to measure the distance between the wafer and the temperature stabilizer; and
the method includes controlling a position of the temperature stabilizer based on the distance which is measured, and
wherein:
the temperature stabilizer includes a compressed air provider formed as at least one opening at the upper surface of the temperature stabilizer, to provide compressed air to the wafer,
the temperature stabilizer includes a vacuum provider formed as at least one opening at the upper surface of the temperature stabilizer, to provide a vacuum, a pressure sensor measures a pressure in a vacuum tube connected to the vacuum provider, and generates a corresponding pressure sensor signal based on the measured pressure, and the actuator system is operated based on the pressure sensor signal, the actuator system moving the temperature stabilizer to correct a position of the temperature stabilizer such that the distance between the wafer and the temperature stabilizer is changed to be in the predetermined range when the distance between the wafer and the temperature stabilizer is out of the predetermined range.

7. The method of claim 6, wherein the actuator system is operated such that the pressure in the vacuum tube is a predetermined range of about −12 kPa±3 kPa.

8. The method as claimed in claim 7, wherein the compressed air provider provides compressed air at about 100 kPa±500 Pa.

9. The method as claimed in claim 6, wherein:
the semiconductor manufacturing apparatus includes an edge sensor, at one side of the temperature stabilizer, to sense a position of the wafer, and
(b) includes rotating the wafer to detect a notch or an orientation flat at an edge of the wafer using the edge sensor, and aligning the position of the wafer based on a position of the notch or orientation flat detected by the edge sensor.

10. The method as claimed in claim 6, wherein the predetermined range is about 25 μm to 35 μm.

* * * * *